(12) United States Patent
Kirn

(10) Patent No.: US 6,937,090 B2
(45) Date of Patent: Aug. 30, 2005

(54) CHARGE INJECTION REDUCTION TECHNIQUE IN SINGLE AND MULTI-REFERENCE SWITCHING AMPLIFIERS

(75) Inventor: Larry Kirn, East Lansing, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 09/941,187

(22) Filed: Aug. 28, 2001

(65) Prior Publication Data

US 2002/0070798 A1 Jun. 13, 2002

Related U.S. Application Data

(60) Provisional application No. 60/228,531, filed on Aug. 28, 2000.

(51) Int. Cl.[7] ................................................. H03F 3/38
(52) U.S. Cl. .......................................... 330/10; 330/251
(58) Field of Search ....................... 330/10, 251, 207 A, 330/257 A

(56) References Cited

U.S. PATENT DOCUMENTS

| | | | |
|---|---|---|---|
| 4,403,196 A | | 9/1983 | Grandmont .................. 330/10 |
| 4,471,314 A | | 9/1984 | Lindberg ..................... 330/10 |
| 4,773,096 A | | 9/1988 | Kirn ............................ 381/120 |
| 5,099,408 A | * | 3/1992 | Chen et al. .................... 363/41 |
| 5,398,003 A | | 3/1995 | Heyl et al. .................... 330/10 |
| 5,506,493 A | * | 4/1996 | Stengel ........................ 323/223 |
| 5,610,553 A | | 3/1997 | Kirn ............................. 330/10 |
| 5,613,010 A | | 3/1997 | Heyl et al. ................... 381/117 |
| 5,617,058 A | * | 4/1997 | Adrian et al. ................. 330/10 |
| 5,886,572 A | | 3/1999 | Myers et al. .................. 330/10 |
| 5,909,153 A | | 6/1999 | Delano et al. ............... 332/107 |
| 5,949,282 A | | 9/1999 | Nguyen et al. ............... 330/10 |
| 5,982,231 A | | 11/1999 | Nalbant ........................ 330/10 |
| 6,150,880 A | | 11/2000 | Schweighofer .......... 330/207 A |
| 6,175,272 B1 | * | 1/2001 | Takita .......................... 330/10 |
| 6,229,388 B1 | | 5/2001 | Nalbant ....................... 330/10 |
| 6,476,673 B2 | * | 11/2002 | Takagishi .................... 330/10 |
| 6,614,297 B2 | * | 9/2003 | Score et al. .................. 330/10 |

* cited by examiner

Primary Examiner—Michael Tokar
Assistant Examiner—Linh Nguyen
(74) Attorney, Agent, or Firm—Gifford, Krass, Groh, Sprinkle, Anderson & Citkowski, PC

(57) ABSTRACT

A method of adding a minimum pulse width to the switching devices of both outputs of a switching differential pair enhances the performance of a switching amplifier. When used with similar switching devices at similar temperatures, this results in injecting a similar error term into both sides of a differential output, thus presenting it as a null common-mode output. That is, by correlating the output to differences between the differential pairs, accurate representations by the switching device outputs are achieved. Although the invention is described in conjunction with two switching devices per side of the differential output pair, operation with three or more switching devices per side, as seen in multi-reference amplifiers, may be accommodated by the invention.

6 Claims, 1 Drawing Sheet

CHARGE INJECTION REDUCTION TECHNIQUE IN SINGLE AND MULTI-REFERENCE SWITCHING AMPLIFIERS

REFERENCE TO RELATED APPLICATION

This application claims priority from U.S. provisional application Ser. No. 60/228,531, filed Aug. 28, 2000, the entire contents of which are incorporated herein by reference.

FIELD OF THE INVENTION

This invention relates generally to switching amplifiers and, in particular, to a charge injection reduction technique applicable to single- and multi-reference configurations.

BACKGROUND OF THE INVENTION

The technique of pulse-width modulating one or more switched voltages or currents to produce an integrated analog representation of the modulation source has been in use for at least two decades. When endeavoring to achieve high accuracy with this approach, however, a parasitic effect of arises in conjunction with most switching devices. In particular, in addition to the desired switched voltage or current, most switching devices inject a portion of the control signal used to effect the state change.

This lack of isolation manifests as an offset in the output which is not directly indicated by the modulation source. Although this is not usually problematic in unipolar designs such as power supplies, bipolar designs, such as pulse-width-modulated amplifiers, may suffer considerable distortion due to the effect. A need exists to nullify this undesired switching device deficiency.

SUMMARY OF THE INVENTION

The present invention is a method of adding a minimum pulse width to all switching devices of both outputs of a switching differential pair. When used with similar switching devices at similar temperatures, this results in injecting a similar error term into both sides of a differential output, thus presenting it as a null common-mode output. That is, by correlating the output to differences between the differential pairs, accurate representations by the switching device outputs are achieved. Although the invention is described in conjunction with two switching devices per side of the differential output pair, operation with three or more switching devices per side, as seen in multi-reference amplifiers, may be accommodated by the invention.

DETAILED DESCRIPTION OF THE INVENTION

Figure 1:
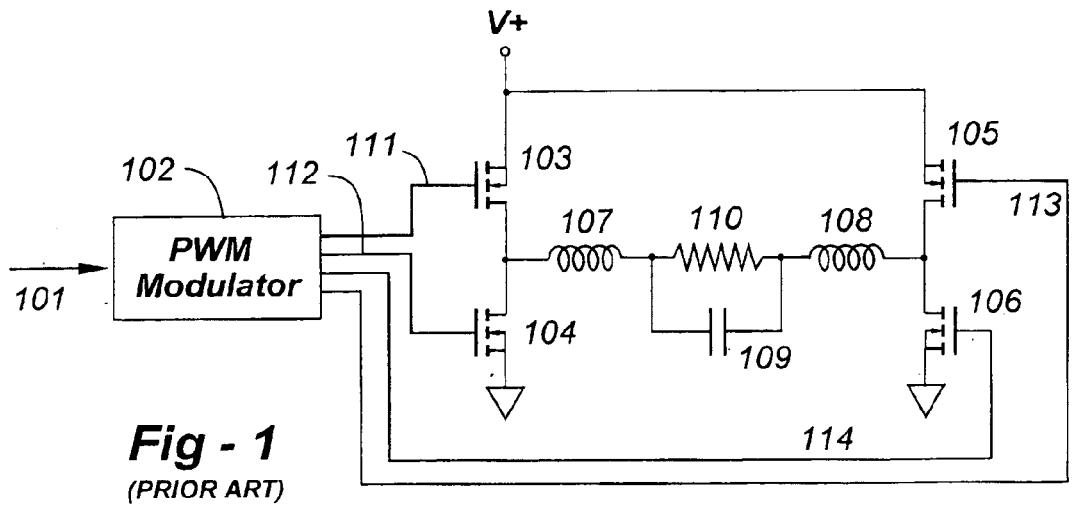
FIG. 1 illustrates a typical bridged-output Class D (PWM) amplifier.

FIG. 1 illustrates a typical bridged-output Class D (PWM) amplifier. Pulse-width modulator 102 converts incoming data stream 101 into pulse-width-modulated drive signals 111, 112, 113 and 114, which drive switching devices 103, 104, 105 and 106, respectively. Inductors 107 and 108, in conjunction with capacitor 109, filter switching components from the outputs of the switching devices, and supply analog output to load 110. Operation of this type of amplifier is well known in the art.

Figure 2:
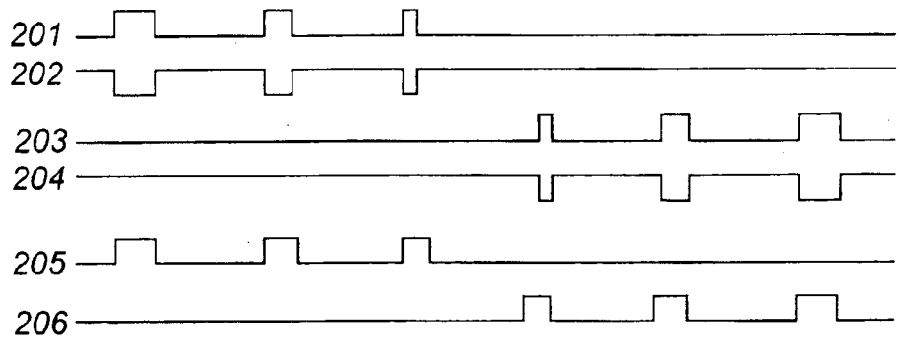
FIG. 2 shows the timing of signals normally encountered in the circuit of FIG. 1.

Referring now to FIG. 2, traces 201 and 202 show inputs to switching devices 103 and 104, respectively, and trace 205 shows output from switching devices 103 and 104 to inductor 107, all of FIG. 1. Trace 203 and 204 show inputs to switching devices 105 and 106, respectively, and trace 206 shows output from switching devices 105 and 106 to inductor 108, again all of FIG. 1. At small pulse widths, it can be seen that outputs are artificially elongated by charge injected principally from control signals to switching devices 103 and 105.

Figure 3:
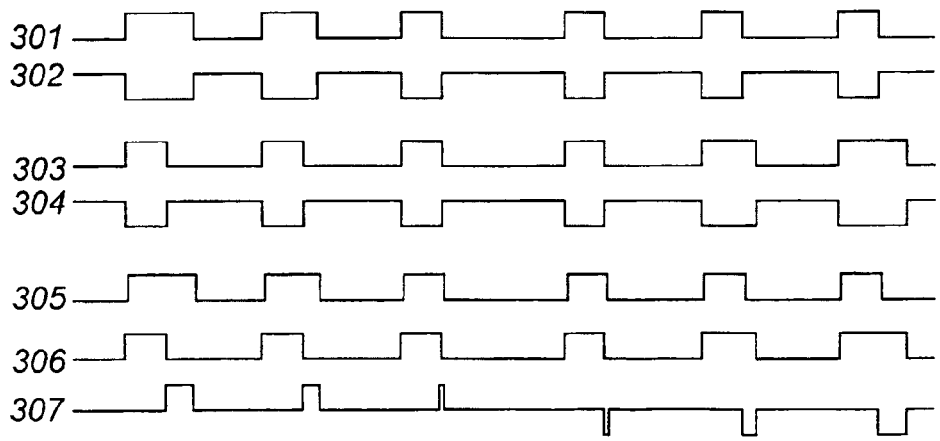
FIG. 3 shows the timing of signals according to the invention in the same operational area.

Referring now to FIG. 3, traces 301 and 302 show inputs to switching devices 103 and 104, respectively, and trace 305 shows output from switching devices 103 and 104 to inductor 107, all of FIG. 1. Trace 303 and 304 show inputs to switching devices 105 and 106, respectively, and trace 306 shows output from switching devices 105 and 106 to inductor 108, again all of FIG. 1.

Trace 307 shows the differential between traces 305 and 306. By correlating output trace 307 to differences between trace 301/302 and 303/304 pairs, accurate representations by switching device outputs can then be seen. Although shown with two switching devices only per side of the differential output pair, operation with three or more switching devices per side, as seen in multi-reference amplifiers, is anticipated.

I claim:

1. In a switching amplifier of the type wherein one or more references are coupled to a load through gated switches controlled by a pulse-width modulated input signal, the improvement comprising:

adding a minimum pulse width of the same polarity to a pair of switching devices simultaneously, one on either side of the load, to null the common-mode output presented to the load.

2. The improved switching amplifier of claim 1, wherein the switches are arranged as differential pairs on either side of the load.

3. The improved switching amplifier of claim 1, wherein the minimum pulse width is added during the pulse-width modulation of the input signal.

4. An enhanced performance switching amplifier coupling an input signal to a load, comprising:

at least one electrically controlled switch coupled to each side of the load; and a waveform generator operative to perform the following functions:

a) control the switches in accordance with the input signal, and b) adding a minimum pulse width of the same polarity simultaneously to both electrically controlled switches to null common-mode output presented to the load.

5. The improved switching amplifier claim 4, wherein the switches are arranged as differential pairs on either side of the load.

6. The improved switching amplifier of claim 4, wherein minimum pulse width is added by the pulse-width modulator.

* * * * *